(12) United States Patent
Paul

(10) Patent No.: US 10,088,541 B2
(45) Date of Patent: Oct. 2, 2018

(54) METHOD AND MAGNETIC RESONANCE SCANNER FOR ACQUIRING A MAGNETIC RESONANCE DATA SET

(71) Applicant: Siemens Aktiengesellschaft, Munich (DE)

(72) Inventor: Dominik Paul, Bubenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 727 days.

(21) Appl. No.: 14/622,091

(22) Filed: Feb. 13, 2015

(65) Prior Publication Data

US 2015/0226819 A1 Aug. 13, 2015

(30) Foreign Application Priority Data

Feb. 13, 2014 (DE) .......................... 10 2014 202 606

(51) Int. Cl.

| | |
|---|---|
| *G01R 33/48* | (2006.01) |
| *G01R 33/54* | (2006.01) |
| *G01R 33/567* | (2006.01) |
| *G01R 33/483* | (2006.01) |
| G01R 33/56 | (2006.01) |
| G01R 33/561 | (2006.01) |

(52) U.S. Cl.
CPC ....... *G01R 33/4828* (2013.01); *G01R 33/482* (2013.01); *G01R 33/4835* (2013.01); *G01R 33/543* (2013.01); *G01R 33/546* (2013.01); *G01R 33/4818* (2013.01); *G01R 33/5607* (2013.01); *G01R 33/5615* (2013.01); *G01R 33/5673* (2013.01); *G01R 33/5676* (2013.01)

(58) Field of Classification Search
CPC .............. G01R 33/4818; G01R 33/482; G01R 33/4828; G01R 33/4835; G01R 33/543; G01R 33/546; G01R 33/5607; G01R 33/5615; G01R 33/5673; G01R 33/5676
See application file for complete search history.

(56) References Cited

U.S. PATENT DOCUMENTS

| | | | | |
|---|---|---|---|---|
| 6,097,185 | A | * 8/2000 | Watanabe | .......... G01R 33/4835 324/307 |
| 6,577,127 | B2 | 6/2003 | Harvey et al. | |
| 7,362,099 | B2 | 4/2008 | Beck | |
| 2014/0159720 | A1* | 6/2014 | Markl | ................ G01R 33/4835 324/309 |

* cited by examiner

*Primary Examiner* — Rishi Patel
(74) *Attorney, Agent, or Firm* — Schiff Hardin LLP

(57) ABSTRACT

In a method and magnetic resonance (MR) scanner for acquiring an MR data set of multiple slices of a volume of interest of an examination object (patient), on receipt of a trigger signal relating to the patient's respiration and indicating the start of an acquisition time window, a fat saturation technique is begun and, in one of a number of acquisition blocks having a number of echo trains each relating to a single slice and a single portion of k-space, wherein all the echo trains of each individual acquisition block relate to different slices, magnetic resonance data for the different slices are acquired. A magnetic resonance image of each slice is determined for that slice by combining magnetic resonance data acquired in different acquisition blocks and relating to a portion of k-space. For at least two of the acquisition blocks, a different sequence of the slices to be acquired by the echo trains is used within the acquisition block.

10 Claims, 3 Drawing Sheets

METHOD AND MAGNETIC RESONANCE SCANNER FOR ACQUIRING A MAGNETIC RESONANCE DATA SET

BACKGROUND OF THE INVENTION

Field of the Invention

The invention relates to a method and magnetic resonance scanner for acquiring a magnetic resonance data set of a plurality of slices of a volume of interest of an examination object (patient).

Description of the Prior Art

For the acquisition of magnetic resonance signals, it is known upon, receiving a trigger signal relating to the patient's respiration and indicating the start of an acquisition time window, to begin a fat saturation technique and, to acquire magnetic resonance signals for the different slices in one of multiple acquisition blocks. These blocks include echo trains each relating to a single slice and a single portion of k-space, and all the echo trains of each individual acquisition block relate to different slices. A magnetic resonance image of each slice is determined by combining the magnetic resonance data acquired in different acquisition blocks and relating to a portion of k-space for that slice.

Magnetic resonance imaging is well established as a clinical imaging method. Acquisition techniques exist in which only the magnetic resonance signal received from water bound protons (water signal) is to be contained in the magnetic resonance data set obtained, but not magnetic resonance signals arising from fat bound protons (fat signals). Various fat saturation techniques are therefore known in which, for example, a fat saturation pulse is emitted at regular intervals as a radiofrequency (RF) pulse.

In addition, magnetic resonance sequences are known in which it is impossible or, because of the image quality, undesirable, to capture the entirety of k-space to be acquired after a single excitation pulse, because excessively severe signal decay occurs. In this context it is known to carry out so-called "multi-shot acquisitions" in which the magnetic resonance sequence is subdivided into a number of echoes or echo trains that differ in their phase encoding portions such that different portions of k-space are acquired by each of these echo trains. In this context, a number of slices are frequently acquired, so that during the execution of echo trains for other slices, the signal of the previously acquired slice can relax again and a new excitation pulse can be generated in the next echo train in relation to that slice. With regard to the fat saturation to be performed, this means that the fat saturation technique is begun using the first echo train so that, for example, the fat saturation pulse is emitted prior to the start of each echo train. The saturation pulse is not slice selective and affects the entire volume of interest. Since a number of fat saturation pulses may be required in order to achieve the desired result, it can happen that sufficient fat saturation is not yet present for the first echo trains, which is not a problem, however, as long as the other portions of k-space are acquired with longer running, sufficient fat saturation for the slices in question.

Problems arise whenever the multi-shot acquisitions are carried out in a triggered manner, in particular by a trigger signal relating to the respiration of the examination object, i.e. of a patient, and indicating the start of an acquisition time window. It has been demonstrated that, in a patient's respiratory cycle, acquisition time windows exist that show only slight movements in the volume of interest affected by respiration. Their start is marked by a particular point in the patient's respiratory cycle, which point is indicated by the trigger signal. The acquisition time window can now be used to execute an acquisition block which contains a plurality of echo trains. It is known to provide an echo train relating to an acquisition block specific portion of k-space in each of the acquisition blocks for each of the slices to be acquired. When an acquisition block is complete, the system waits for the next trigger signal.

In an example involving four slices S1, S2, S3 and S4 to be acquired and a segmentation of k-space into four portions K1, K2, K3 and K4, this means, for the first acquisition block, that the portion K1 is successively acquired for the slices S1, S2, S3, S4, in the second acquisition block the portion K2 for the slices S1, S2, S3, S4, etc. The fat saturation technique is also restarted for each acquisition block, as cyclical continuation of the fat saturation technique is not automatically possible because of the unknown duration of the pauses between the acquisition blocks.

However, in the case of triggered multi-shot acquisitions with fat saturation, the result of this is that a fat signal varying across the slices can occur. The effect of this is that the first slices in an acquisition block have a very low fat saturation, whereas the other slices have a more marked fat saturation. If, for example, five slices are acquired in an acquisition block, it may occur that fat saturation is not complete for the first two slices to be acquired in an acquisition block. If, for example, twenty slices are to be acquired in this way, wherein only five echo trains, for example, are possible within the acquisition time window, the effect is repeated for each slice group, so that, for example, eight out of twenty slices exhibit no or only low fat saturation. This results in a noticeable difference in image quality for different slices.

SUMMARY OF THE INVENTION

An object of the invention is, for triggered multi-shot acquisitions of a plurality of slices with fat saturation, to provide an acquisition method that provides more uniform fat saturation for all the slices.

This object is achieved in accordance with the invention by a method of the type described above, but wherein, for at least two, preferably all, of the acquisition blocks, a different sequence of the slices to be acquired by the echo trains is used within the acquisition block.

Thus, in accordance with the invention, the sequence of the slices within the acquisition block is varied. Whereas a fixed scheme for the slice sequence has been used in the prior art, the slice sequence in accordance with the invention is varied in different acquisition blocks, in particular always between time-adjacent acquisition blocks. In this way, it is always different slices that are affected by the not-yet-complete saturation effect, so that in particular if each slice is equally subject to the not yet complete fat saturation, a homogenous image quality in terms of fat saturation is produced across all the slices. This means that slice images in which clearly insufficient fat saturation is present are no longer produced. The method according to the invention allows fat saturation to be improved across the slice stack for triggered acquisitions.

The slices can be cyclically permutated in consecutive acquisition blocks or the slice sequence can be randomly selected for each acquisition block. Particularly in the case of a fairly small number of slices, a cyclical permutation proves to be the most advantageous option, so that e.g. in the case of four slices S1, S2, S3, S4, starting from the conventional slice sequence S1, S2, S3, S4, in the next acquisition block the sequence S2, S3, S4, S1 can be acquired, in the one after that the sequence S3, S4, S1, S2, etc. Alternatively, however, it is possible to implement random sequences.

In an exemplary embodiment of the present invention, the same echo train can continue to be executed for all the slices in an acquisition block, the same portion of k-space therefore being acquired for all the slices within an acquisition block. However, this does not prove to be the most advantageous embodiment, as the contrasts in the magnetic resonance data are mainly determined by the region of the k-space center, the k-space center consequently being acquired for at least one slice initially, i.e. when fat saturation is not yet completely present.

In a preferred embodiment, a departure is made from this acquisition-block-specific portion of k-space for all the slices. The sequence of the portions of k-space to be acquired within all the acquisition blocks can be selected such that a portion encompassing the center of k-space is acquired no earlier than the third echo train. It has been shown that fat saturation mostly needs approximately two echo trains in order to attain a sufficiently high, i.e. desired, level, so that it is advantageous to acquire the k-space center-encompassing portion of k-space to be acquired for each slice no earlier than the third echo train of an acquisition block. This consequently always ensures that echo trains which, because of their phase encoding, acquire a portion containing the center of k-space, are not used until a later point within an acquisition block. In a preferred embodiment, the portions encompassing the center of k-space are always acquired last in an acquisition block, if the number of slices is greater than the number of portions of k-space for each slice.

In another exemplary embodiment of the present invention, which is advantageous in this respect, the sequence of the portions of k-space within each acquisition block is selected on the basis of the proximity of the portion to the center of k-space such that portions closer to the center of k-space are acquired later than portions farther from the center of K space. As used herein, a "portion encompassing the center of k-space," in particular having a separation of zero, means the portion closest to the center of k-space. In this way, peripheral regions of k-space are therefore acquired if necessary in the event of insufficient fat saturation, so that a further increase in image quality is achieved in respect of fat saturation. Altogether this means therefore that the more closely the echo train approaches the central echo, i.e. the center of k-space, the farther back in the sequence the acquisition of the corresponding slice with the echo train within the acquisition block shall take place. For example, if there are five portions of k-space that are to be acquired in echo trains, i.e. the portions K1, K2, K3, K4 and K5, wherein k-space is composed piecewise sequentially of the individual portions, this would result in the sequence K1, K5, K2, K4, K3, for example, which is fixed for all the acquisition blocks.

For the practical implementation of fat saturation it can be provided, as is generally known, that an RF pulse for fat saturation (fat saturation pulse) is emitted prior to the start of an echo train relating to a slice and a portion of k-space. However, other fat saturation techniques can basically be used which only develop their effect over time. In addition, the method according to the invention is particularly suitable for turbo spin-echo sequences (TSE sequences).

It is also possible for the trigger signal to be determined by evaluating a navigator data set and/or from breathing belt and/or breathing sensor signals. Different ways therefore exist of determining a trigger signal indicating a particular point in time in the respiratory cycle, this signal indicating the start of the acquisition time window. Navigators, i.e. in particular one-dimensional magnetic resonance acquisitions, are less preferred because of the additional capacity utilization of the magnetic resonance scanner; additionally or alternatively breathing belts and/or breathing sensors which can be incorporated, for example, into the patient couch of the magnetic resonance scanner with which the method according to the invention is carried out.

In addition to the method, the invention also relates to a magnetic resonance scanner having a control device that is designed to carry out the inventive method. All comments relating to the inventive method apply analogously to the inventive magnetic resonance scanner, which therefore also provides the advantages of the method. The control device thus evaluates the trigger signal and controls the components of the magnetic resonance scanner such that the echo trains are emitted in the described sequence of the slices and possibly of the portions of k-space.

DESCRIPTION OF THE PREFERRED EMBODIMENTS

Figure 1:
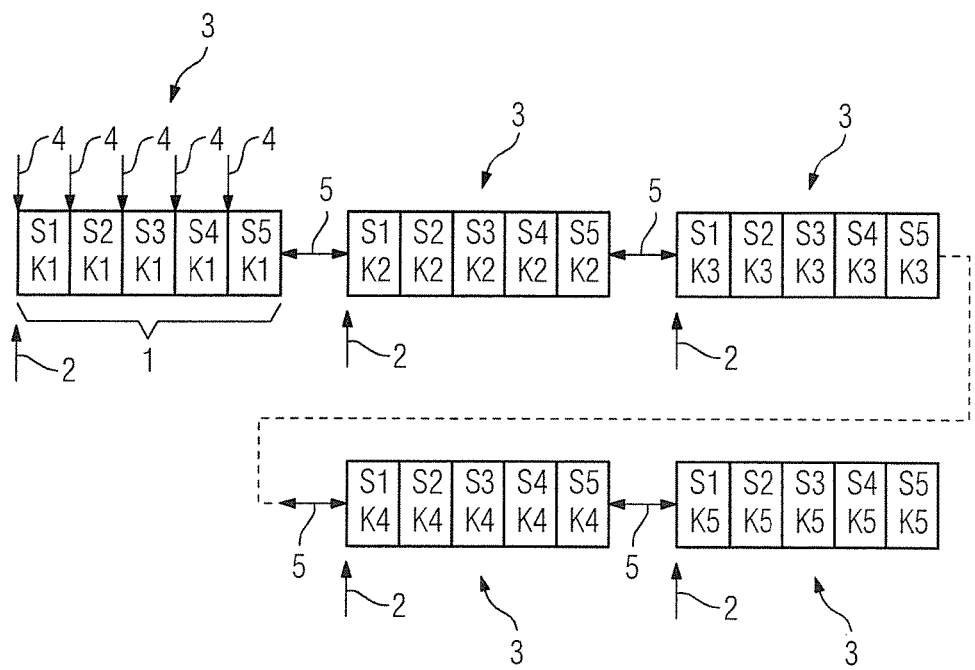
FIG. 1 shows an acquisition sequence according to the prior art.
Figure 3:
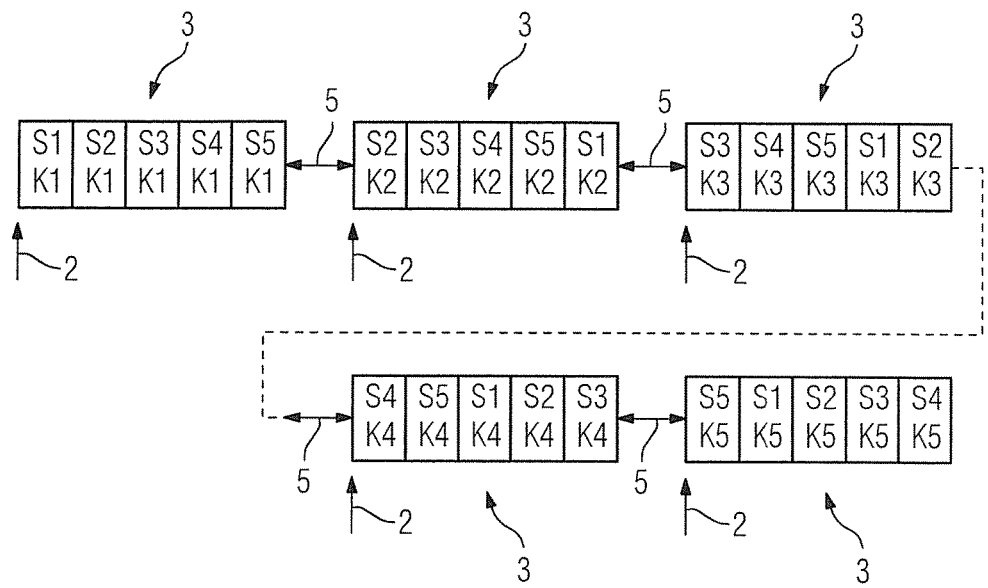
FIG. 3 shows an acquisition sequence in a first embodiment of the method according to the invention.

If respiration-triggered multi-shot acquisitions of a plurality of slices are to be carried out according to the prior art, an acquisition sequence as shown in FIG. 1 for five slices S1, S2, S3, S4, S5 and five k-space portions K1, K2, K3, K4, K5 is normally used. It should be noted at the outset that, for all the exemplary embodiments shown here, the trigger signal indicating a particular breathing state at which an acquisition time window 1 begins and marked by arrows 2 in FIGS. 1, 3 and 5 can be obtained optionally and/or in a combined manner by evaluating a navigator acquired using the magnetic resonance scanner, from sensor data of a breathing belt and/or from sensor data of some other breathing sensor. In addition, TSE sequences, which are frequently employed for such multi-shot acquisitions, are used herein by way of example.

As shown, because of the time-limited length of the acquisition time window 1, the examination breaks down into five acquisition blocks 3, each beginning with the application of the trigger signal, arrow 2. In each of the acquisition blocks 3, five echo trains are played out to acquire magnetic resonance data, for each slice in a fixed sequence S1, S2, S3, S4, S5. During the first acquisition block, the first portion K1 of k-space of the slices S1, S2, S3, S4, S5 is acquired, in the second acquisition block 3 the portion K2, etc.

On application of the trigger signal, arrow 2, the execution of a fat saturation technique also begins, wherein in the present case an RF signal for fat saturation (fat saturation signal) is emitted prior to the emission of each echo train, so that cyclical emission takes place. For the sake of clarity, this is only indicated for the first acquisition block 3 by the arrows 4.

This cyclical operation cannot be usefully continued, as the length of the pauses 5 between the acquisition blocks 3 varies and cannot be predicted.

Figure 2:
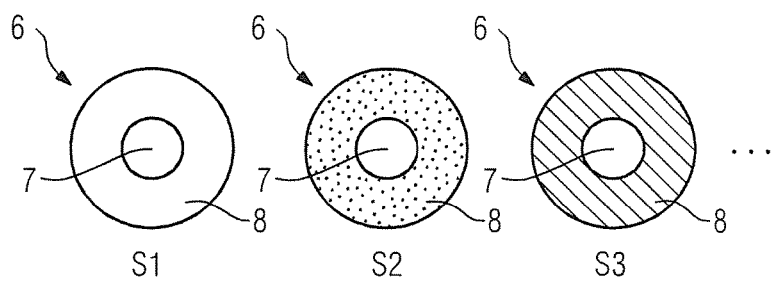
FIG. 2 is a schematic diagram of slice images acquired using the acquisition sequence according to FIG. 1.

However, as the fat saturation technique requires some time, specifically a number of saturation pulses, until the spins in the fat-bound protons are sufficiently saturated, there is insufficient fat saturation signal for the slices S1 and S2 in each case, which is clearly shown in the slice images 6 reconstructed by combining the magnetic resonance data of each slice of all the acquisition blocks 3, as illustrated schematically in FIG. 2. Shown there in the form of a schematic diagram for each slice image 6 is an inner, mainly water-bound proton containing region 7 and an outer, mainly fat-bound proton containing region 8. Because of the still barely present fat saturation, both regions 7, 8 appear clear in the slice image 6 of the slice S1, i.e. signal-rich. In respect of the slice S2, fat saturation is already becoming effective, so that the region 8 appears clearly darkened, but not yet black as required, as indicated by the dotted representation. However, as the slice image 6 of the slice S3 shows, the desired level of fat saturation has been reached there and the region 8 appears black, as indicated by the hatching, i.e. is largely signal-free.

Using the method according to the present invention, it is now possible to achieve uniform fat saturation for all the slices S1, S2, S3, S4 and S5. For that, a first exemplary embodiment of the method according to the invention is again illustrated in FIG. 3 in the form of an acquisition sequence.

As is apparent, in contrast to FIG. 1, the slice acquisition sequence differs from acquisition block 3 to acquisition block 3. In this case, the slices S1, S2, S3, S4 and S5 are cyclically permutated from one acquisition block 3 to the next. As a result, in this exemplary embodiment a single portion K1, K2, K3, K4 or K5 in the first echo train of an acquisition block 3 and a single portion K1, K2, K3, K4 or K5 in the second echo train of an acquisition block 3 is acquired for each slice S1, S2, S3, S4 and S5. This means that each slice S1, S2, S3, S4 and S5 is at least similarly subject to the effect of the only subsequently occurring fat saturation. If the magnetic resonance data of all the acquisition blocks 3 is combined for each slice, this provides greatly improved quality in respect of fat saturation, in particular a uniform fat saturation.

Figure 4:
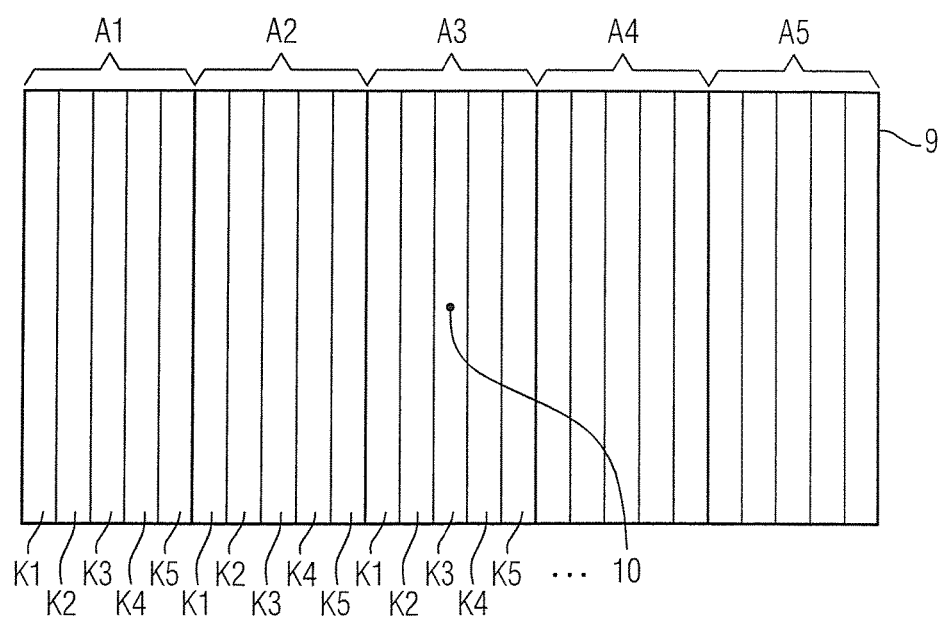
FIG. 4 shows a segmentation of k-space to be acquired.

By not only changing the slice sequence compared to FIG. 1 but also departing from the assignment of a portion K1-K5 to each acquisition block 3, a further qualitative improvement can be achieved. In this connection FIG. 4 first again shows more precisely the subdivision of k-space 9 to be acquired. This is initially split up into segments A1 to A5 from which an echo is acquired in each echo train, so that each segment A1 to A5 can be decomposed into sub-segments associated with the portions K1 to K5. Finally a k-space trajectory passing through k-space 9 is decomposed accordingly. As can be seen, the portions K1, K5 constitute outlying sub-segments for the relevant central segment A3 containing the center 10 of k-space 9, whereas the sub-segments of the portions K2 and K4 are closer to the center 10 of k-space 9. The sub-segment of the portion K3 lastly contains the center 10 of k-space 9. If the knowledge that the central region of k-space 9 mainly determines the contrasts is now utilized, the sequence of portions K1, K2, K3, K4 and K5 within an acquisition block 3 can be selected such that subsequent positions within the acquisition block 3 and therefore improved fat saturation are provided for the inner regions of k-space 9 in the relevant segment A3.

Figure 5:
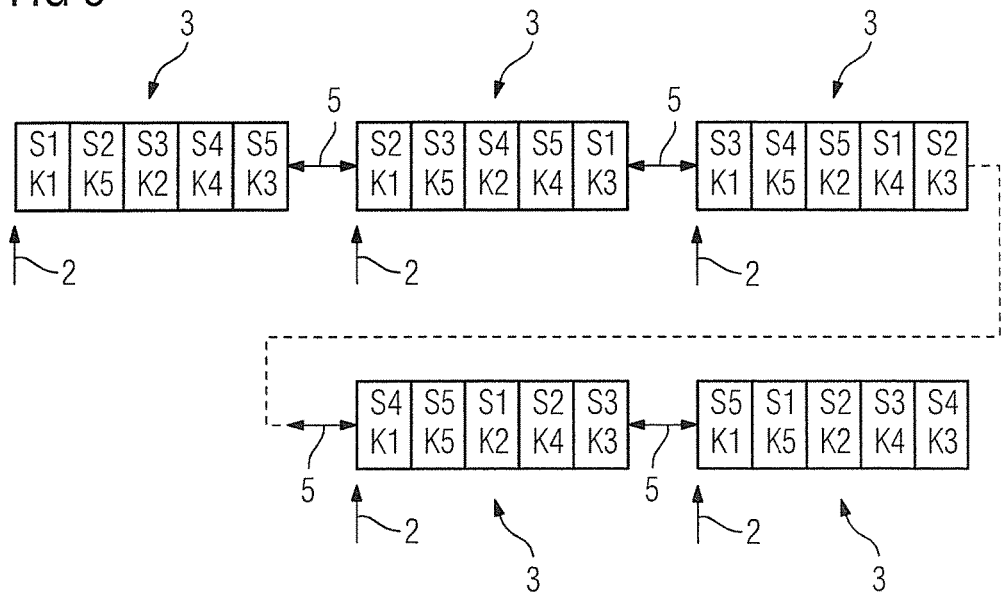
FIG. 5 shows an acquisition sequence of a second exemplary embodiment of the method according to the invention.

A corresponding implementation is shown by the second exemplary embodiment for an acquisition sequence according to the present invention, as illustrated by FIG. 5. As can be seen, the sequence of the slices S1, S2, S3, S4 and S5 is cyclically permutated as in the exemplary embodiment according to FIG. 3, but with additionally a fixed sequence of portions K1, K2, K3, K4 and K5 of k-space 9 for all the acquisition blocks 3, namely K1, K5, K2, K4 and K3 in this case. The portions K1, K2, K3, K4 and K5 are therefore sorted therein according to their proximity to the center 10 of k-space 9, so that the portion K5 containing the center 10 of k-space 9 is always acquired last, i.e. when maximum fat saturation has been achieved.

Figure 6:
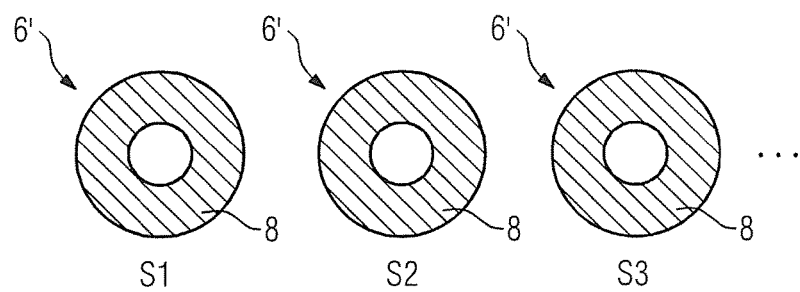
FIG. 6 shows a schematic diagram of slice images acquired using the method according to the invention.

The effect of this change in the sequence of the slices S1, S2, S3, S4 and S5 and optimally also in the sequence of the portions K1, K2, K3, K4 and K5 is schematically illustrated in FIG. 6. The slice images 6' of the slices S1, S2 and S3 obtained from the combined magnetic resonance data of the acquisition blocks each show, in the region 8, an excellent darkening which is essentially the same for all the slices.

Figure 7:
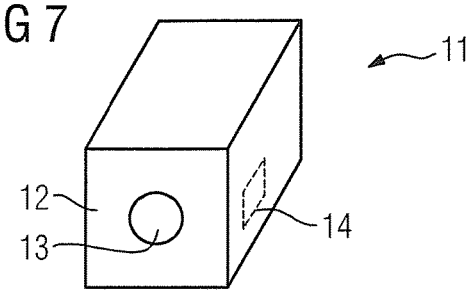
FIG. 7 shows a magnetic resonance scanner according to the invention.

FIG. 7 shows a schematic diagram of an inventive magnetic resonance scanner 11 that has, as is generally known, a main magnet unit 12 defining a patient tunnel 13. Provided around the patient tunnel 13 are an RF coil arrangement and a gradient coil arrangement (not shown). Also not shown for clarity is a patient bed on which the patient can be moved into the patient tunnel 13 and that can contain the breathing sensors which supply sensor data for the trigger signal.

The operation of the magnetic resonance scanner 11 is controlled via a control device 14 that is designed to carry out the method according to the invention, i.e. in particular selecting the sequence within the acquisition blocks 3 for optimum image quality in respect of fat saturation.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for acquiring a magnetic resonance data set of a plurality of slices of a volume of interest in an examination subject, comprising:

obtaining a plurality of trigger signals from an examination subject situated in a magnetic resonance data acquisition unit based on respiration of said examination subject;

providing said trigger signals to a control computer and, upon receipt of each trigger signal, beginning, from said control computer, operation of said magnetic resonance data acquisition unit to execute a respective fat saturation magnetic resonance data acquisition procedure comprising an acquisition block having a plurality of echo trains respectively relating to different individual slices of a plurality of slices of a volume of interest in the examination subject;

from said control computer, operating said magnetic resonance data acquisition unit to acquire, from said echo trains in each respective acquisition block, magnetic resonance data for each of said plurality of individual different slices and entering the magnetic resonance data acquired for each individual slice into a respective portion of k-space in an electronic memory organized as k-space;

from said control computer, in at least two of said acquisition blocks, operating said magnetic resonance data acquisition unit to acquire the magnetic resonance data from said plurality of individual different slices in respective sequential orders of said slices that differ from each other;

in an image reconstruction computer having access to said electronic memory, reconstructing a magnetic resonance image of each slice from the magnetic resonance data entered, in all of said acquisition blocks, into the respective portion of k-space for that slice; and from said image reconstruction computer, making the respective reconstructed images of the plurality of slices available in electronic form as at least one data file.

2. A method as claimed in claim 1 comprising, from said computer, operating said magnetic resonance data acquisition unit to acquire said magnetic resonance data from the respective slices in respective different sequential orders of said slices in at least two of said acquisition blocks by cyclically permutating, in successive acquisition blocks, said sequential orders of said slices.

3. A method as claimed in claim 1 comprising, from said computer, operating said magnetic resonance data acquisition unit to acquire said magnetic resonance data from the respective slices in respective different sequential orders of said slices in at least two of said acquisition blocks by randomly selecting a different one of said sequential orders of said slices respectively for each acquisition block.

4. A method as claimed in claim 1 wherein said portions of k-space into which the respective magnetic resonance data acquired from the individual different slices are entered include a central portion of k-space, and entering said magnetic resonance data into said central portion of k-space no earlier than with a third of said plurality of echo trains in each of said acquisition blocks.

5. A method as claimed in claim 1 comprising entering said magnetic resonance data acquired from the respective different individual slices in each acquisition block in a data entry sequence within each acquisition block wherein magnetic resonance data are entered into the respective portions of k-space dependent on a proximity of the respective portions of k-space to a center of k-space, with portions closer to said center of k-space being entered with data later than portions that are farther from the center of k-space.

6. A method as claimed in claim 1 comprising, from said computer, operating said magnetic resonance data acquisition unit in each of said acquisition blocks to radiate a radio-frequency pulse for fat saturation prior to a beginning of an echo train for a respective slice.

7. A method as claimed in claim 1 comprising operating said magnetic resonance data acquisition unit from said computer in said fat saturation magnetic resonance acquisition procedure wherein said echo trains are turbo spin-echo sequences.

8. A method as claimed in claim 1 comprising obtaining said trigger signal by operating said magnetic resonance data acquisition unit from said control computer to acquire a navigator data set that represents movement of the examination subject due to respiration.

9. A method as claimed in claim 1 comprising obtaining said trigger signal from a respiration signal acquired from the patient by a device selected from the group consisting of a breathing belt and a breathing sensor.

10. A magnetic resonance apparatus comprising:

a magnetic resonance data acquisition unit;

a control computer provided with a plurality of trigger signals obtained from an examination subject situated in the magnetic resonance data acquisition unit, said trigger signals being based on respiration of the examination subject;

said control computer, upon receipt of each trigger signal, being configured to begin operation of said magnetic resonance data acquisition unit to execute a respective fat saturation magnetic resonance data acquisition procedure comprising an acquisition block having a plurality of echo trains respectively relating to different individual slices of a plurality of slices of a volume of interest in the examination subject;

an electronic memory organized as k-space;

said control computer being configured to operate said magnetic resonance data acquisition unit to acquire, from said echo trains in each respective acquisition block, magnetic resonance data for each of said plurality of individual different slices and to enter the magnetic resonance data acquired for each individual slice into a respective portion of k-space in the electronic memory organized as k-space;

said control computer being configured, in at least two of said acquisition blocks, to operate said magnetic resonance data acquisition unit to acquire the magnetic resonance data from said plurality of individual different slices in respective sequential orders of said slices that differ from each other;

an image reconstruction computer having access to said electronic memory, configured to reconstruct a magnetic resonance image of each slice from the magnetic resonance data entered, in all of said acquisition blocks, into the respective portion of k-space for that slice; and said image reconstruction computer being configured to make the respective reconstructed images of the plurality of slices available in electronic form as at least one data file.

* * * * *